United States Patent
Luo

(10) Patent No.: US 9,508,685 B2
(45) Date of Patent: Nov. 29, 2016

(54) VERTICALLY INTEGRATED WAFERS WITH THERMAL DISSIPATION

(71) Applicant: Empire Technology Development LLC, Wilmington, DE (US)

(72) Inventor: Zhijiong Luo, Poughkeepsie, NY (US)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 64 days.

(21) Appl. No.: 14/445,991

(22) Filed: Jul. 29, 2014

(65) Prior Publication Data

US 2016/0035702 A1 Feb. 4, 2016

(51) Int. Cl.
*H01L 25/00* (2006.01)
*H01L 21/60* (2006.01)
(Continued)

(52) U.S. Cl.
CPC ..... *H01L 25/0657* (2013.01); *H01L 21/28518* (2013.01); *H01L 21/28568* (2013.01); *H01L 21/3065* (2013.01); *H01L 21/30604* (2013.01); *H01L 21/8221* (2013.01); *H01L 23/36* (2013.01); *H01L 24/32* (2013.01); *H01L 24/75* (2013.01); *H01L 24/83* (2013.01); *H01L 25/50* (2013.01); *H01L 23/53214* (2013.01); *H01L 23/53228* (2013.01); *H01L 23/53257* (2013.01); *H01L 2021/60007* (2013.01); *H01L 2021/60097* (2013.01); *H01L 2224/2745* (2013.01); *H01L 2224/27452* (2013.01); *H01L 2224/27614* (2013.01); *H01L 2224/27848* (2013.01); *H01L 2224/291* (2013.01); *H01L 2224/32113* (2013.01); *H01L 2224/32145* (2013.01); *H01L 2224/7525* (2013.01); *H01L 2224/838* (2013.01); *H01L 2225/06541* (2013.01); *H01L 2225/06572* (2013.01); *H01L 2225/06589* (2013.01); *H01L 2924/01013* (2013.01); *H01L 2924/01014* (2013.01); *H01L 2924/01022* (2013.01); *H01L 2924/01028* (2013.01); *H01L 2924/01029* (2013.01); *H01L 2924/01042* (2013.01); *H01L 2924/01073* (2013.01); *H01L 2924/01074* (2013.01); *H01L 2924/2064* (2013.01); *H01L 2924/20641* (2013.01)

(58) Field of Classification Search
CPC .......... H01L 2021/60007; H01L 2021/60097
See application file for complete search history.

(56) References Cited

U.S. PATENT DOCUMENTS 7,378,331 B2    5/2008  Shaheen et al.
8,343,851 B2    1/2013  Kim et al.

OTHER PUBLICATIONS

"Salicide," accessed at http://en.wikipedia.org/w/index.php?title=Salicide&oldid=550247285, Last modified on Apr. 14, 2013, pp. 1-2.

(Continued)

*Primary Examiner* — Daniel Luke
(74) *Attorney, Agent, or Firm* — Turk IP Law, LLC

(57) ABSTRACT

Technologies are generally described related to three-dimensional integration of integrated circuits (ICs) with spacing for heat dissipation. According to some examples, a self-aligned silicide may be formed in a temporary silicon layer and removed subsequent to bonding of the wafers to achieve improved contact between the combined ICs and enhanced heat dissipation through added spacing between the ICs.

9 Claims, 7 Drawing Sheets

(51) Int. Cl.
  *H01L 25/065* (2006.01)
  *H01L 23/00* (2006.01)
  *H01L 21/285* (2006.01)
  *H01L 21/306* (2006.01)
  *H01L 21/3065* (2006.01)
  *H01L 21/822* (2006.01)
  *H01L 23/36* (2006.01)
  *H01L 23/532* (2006.01)

(56) References Cited

OTHER PUBLICATIONS

"SunRay Scientific ZTACH™ anisotropic conductive adhesives enable low cost, flip chip assembly of LEDs," accessed at https://sites.google.com/site/sunraysblog/Blog/sunrayscientificztachmanisotropicconductiveadhesivesenablelowcostflipchipassemblyofledsuntitledpost, Jul. 28, 2010, p. 1.

VERTICALLY INTEGRATED WAFERS WITH THERMAL DISSIPATION

BACKGROUND

Unless otherwise indicated herein, the materials described in this section are not prior art to the claims in this application and are not admitted to be prior art by inclusion in this section.

Effective wafer-to-wafer connection and heat dissipation are some of the challenges in three dimensional wafer integration. When two or more wafers are integrated together, spacing between the two wafers may be typically needed for heat dissipation, while still obtaining sufficient electrical connections between the two wafers. For example, direct bonding between copper contacts on two wafers may involve super-flat surfaces to achieve sufficient connection, which may not be easily achievable through conventional fabrication techniques or increase cost of fabrication.

The present disclosure identifies and evaluates current attempts to achieve thermal dissipation in three-dimensionally integrated wafers can be improved with alternative and/or additional solutions in order to effectively provide higher thermal dissipation without degrading electrical connectivity between the integrated wafers.

SUMMARY

The present disclosure generally describes techniques to maintain electrical connectivity between three-dimensionally integrated semiconductor device wafers with enhanced thermal dissipation characteristics. Examples of the described techniques may be manifested as devices, methods, systems, and manufacturing processes, to name a few.

According to some examples, three-dimensionally integrated semiconductor devices are described. An example semiconductor device may include a first wafer comprising a first set of semiconductor circuitry, a second wafer comprising a second set of semiconductor circuitry, and one or more silicide layers between conductive coupler surfaces of the first wafer and the second wafer, the silicide layers effective to bond the first wafer and the second wafer and to provide heat dissipation for the first set of semiconductor circuitry and the second set of semiconductor circuitry through gaps between the silicide layers.

According to further examples, methods to fabricate a three-dimensionally integrated semiconductor device may be described. An example method may include depositing an amorphous/porous silicon layer on a first surface of a first wafer, positioning a first surface of a second wafer over the amorphous/porous silicon layer such that the first surface of the second wafer overlaps with the first surface of the first wafer, and bonding the first wafer and the second wafer with the amorphous/porous silicon layer between the first wafer and the second wafer. The example method may also include heat-treating the bonded first wafer and the second wafer such that silicide layers form between conductive coupler surfaces of the first wafer or second wafer and removing intact portions of the amorphous/porous silicon layer between the first wafer and the second wafer.

According to other examples, methods to fabricate a three-dimensionally integrated semiconductor device may be described. An example method may include depositing an amorphous/porous silicon layer on a first surface of a first wafer, selectively removing one or more portions of the amorphous/porous silicon layer, positioning a first surface of a second wafer over the amorphous/porous silicon layer such that the first surface of the second wafer overlaps with the first surface of the first wafer, bonding the first wafer and the second wafer with the amorphous/porous silicon layer between the first wafer and the second wafer, and heat-treating the bonded first wafer and the second wafer such that silicide layers form between conductive coupler surfaces of the first wafer or second wafer.

According to yet further examples, a system configured to fabricate a three-dimensionally integrated semiconductor device may be described. An example system may include a deposition module configured to deposit an amorphous/porous silicon layer on a surface of a first wafer; a positioning module configured to position a surface of a second wafer over the amorphous/porous silicon layer such that a corresponding surface of the second wafer overlaps with the surface of the first wafer; and a bonding module configured to bond the first wafer and the second wafer with the amorphous/porous silicon layer between the first wafer and the second wafer. The example system may also include a heat-treatment module configured to anneal the bonded first wafer and the second wafer such that silicide layers form between conductive coupler surfaces of the first wafer and second wafer; an etching module configured to remove portions of the amorphous/porous silicon layer prior to the bonding or after the annealing; and a controller configured to coordinate operations of the deposition module, the positioning module, the bonding module, the heat-treatment module, and the etching module.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
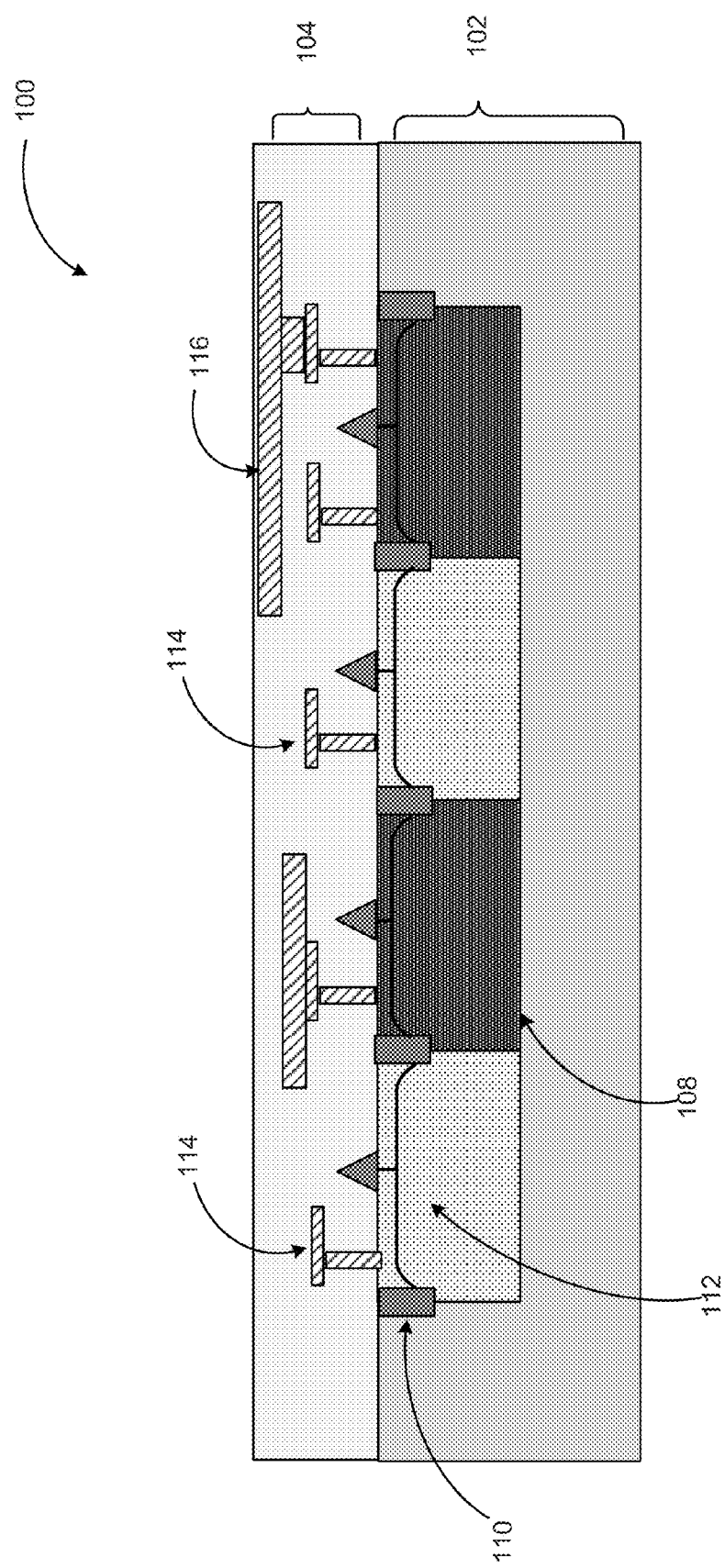
FIG. 1 illustrates an example planar wafer that includes multiple integrated circuits.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to devices, methods, systems, and manufacturing processes related to three-dimensional integration of semiconductor device wafers with enhanced heat dissipation characteristics.

Briefly stated, technologies are generally described related to three-dimensional integration of integrated circuits (ICs) with spacing for heat dissipation. According to some examples, a self-aligned silicide may be formed in a temporary silicon layer and removed subsequent to bonding of the wafers to achieve improved contact between the combined ICs and enhanced heat dissipation through added spacing between the ICs.

FIG. 1 illustrates an example planar wafer that includes multiple integrated circuits, arranged in accordance with at least some embodiments described herein.

Diagram 100 shows an example wafer with multiple semiconductor devices or integrated circuits. The wafer may include a substrate 102 and an insulating layer 104 over the substrate 102. Various portions 110, 112, 108 of the substrate 102 may be implanted with varying concentrations of dopants, for example, to form components of the semiconductor devices and/or integrated circuits within the wafer. The insulating layer 104 may include conductive paths 114 and 116, which may be used to couple the components of the semiconductor devices and/or integrated circuits within the wafer to external components, other devices, and/or other circuitry.

Depending on the type and configuration of the semiconductor devices and/or integrated circuits within the wafer, the portions 110, 112, and 108 may have different shapes and dopant concentrations, for example. The substrate 102 may comprise silicon, Gallium-Arsenide, sapphire, or other suitable materials. The substrate 102 may also be doped, for example, at a selected concentration of dopants in some embodiments. The conductive paths 114 and 116 may comprise any appropriate metal such as Nickel, Tungsten, Titanium, Molybdenum, Tantalum, Copper, or similar metals. Some of the conductive paths (114) may be buried within the insulating layer 104, while other conductive paths (116) may be externally accessible such as from an exposed layer.

According to some embodiments, semiconductor devices or integrated circuits within a wafer may be fabricated using at least one of the semiconductor fabrication techniques selected from the group of chemical vapor deposition (CVD), low pressure CVD (LPCVD), atmospheric pressure CVD (APCVD), ultrahigh vacuum CVD (UHVCVD, atomic layering deposition (ALD), molecular layer deposition (MLD), plasma enhanced CVD (PECVD), physical vapor deposition (PVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

Figure 2:
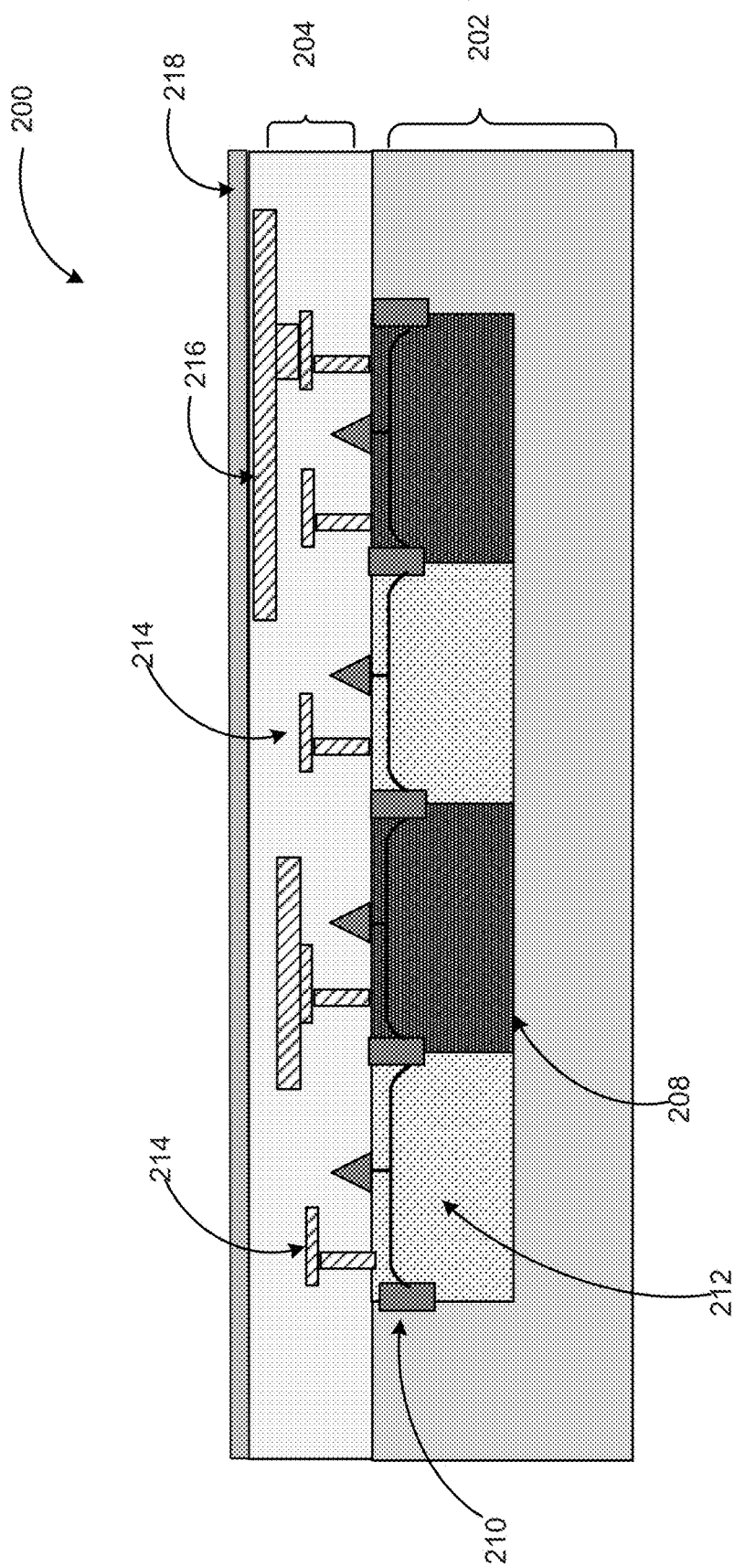
FIG. 2 illustrates an example wafer with a silicon layer to be integrated vertically with another example wafer.

FIG. 2 illustrates an example wafer with a silicon layer to be integrated vertically with another example wafer, arranged in accordance with at least some embodiments described herein.

Diagram 200 shows another example wafer with multiple semiconductor devices or integrated circuits in similar configuration to the wafer of the diagram 100. The wafer of diagram 200 may also include a substrate 202 and an insulating layer 204 over the substrate 202. Various portions 210, 212, 208 of the substrate 202 may be implanted, for example, with varying concentrations of dopants to form components of the semiconductor devices and/or integrated circuits within the wafer. The insulating layer 204 may include conductive paths 214 and 216, which may be used to couple the components of the semiconductor devices and/or integrated circuits within the wafer to external components, other devices, and/or other circuitry.

In some examples, the wafers of diagram 100 and diagram 200 may be integrated vertically by connecting the conductive paths 116 and 216. If the wafers are integrated through direct bonding, the coupler surfaces of the conductive paths 116 and 216 may be super-flat (e.g., a root mean square roughness less than about 1-2 μm) to ensure an electrical coupling of sufficient quality and to avoid/reduce parasitic capacitances and uncontrolled resistance between the connected circuits of the semiconductor devices. On the other hand, the overall thermal energy (e.g., heat) generated by the circuits in the respective wafers may be increased when the wafers are integrated (two integrated circuits operating and generating heat in close proximity to one another). The present disclosure recognizes that thermal dissipation mechanisms may be needed to be designed into the integrated wafers to better manage dissipation of thermal energy.

As a starting phase of vertical integration of two wafers with thermal dissipation and enhanced electrical couplers between the wafers, the wafer in the diagram 200 includes an amorphous/porous silicon layer 218 deposited over the insulating layer 204. The amorphous/porous silicon layer 218 may be undoped to avoid uncontrolled electrical coupling between the wafers. The porosity of the amorphous/porous silicon layer 218 may be in a range from about 0% to about 80% porosity.

In other embodiments, top surfaces (surfaces to be bonded together) of the two wafers may both be treated with amorphous/porous silicon. In some implementations, amorphous/porous silicon layers of substantially equal thickness may be deposited on both surfaces. In other implementations, amorphous/porous silicon layers of different thickness may be deposited on the wafer surfaces. In some embodiments, the thickness of the amorphous/porous silicon layers may be in a range from about 1 nm to about 100 μm.

Figure 3:
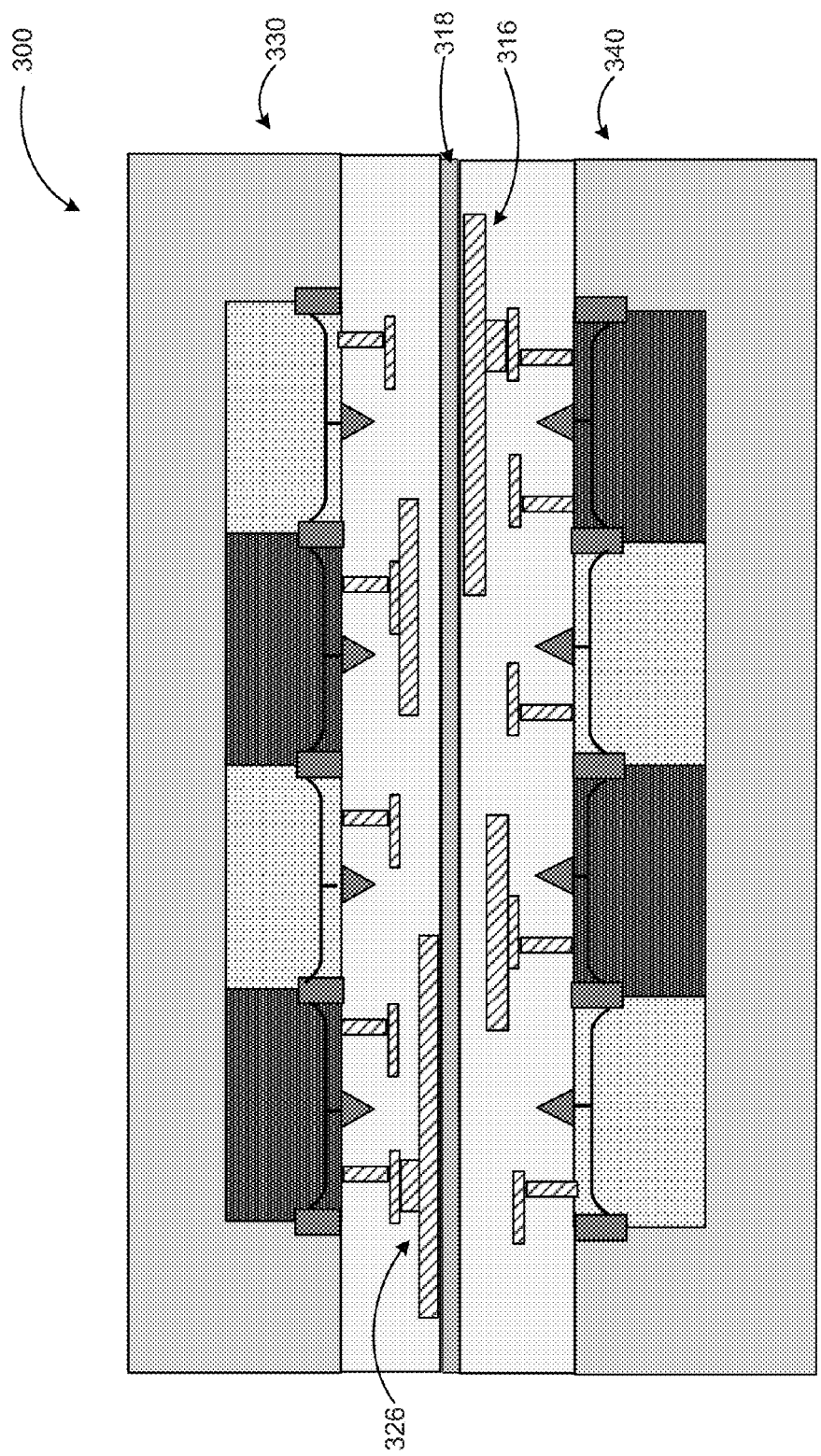
FIG. 3 illustrates two example wafers bonded together through the silicon layer with one of the wafers flipped.

FIG. 3 illustrates two example wafers bonded together through the silicon layer with one of the wafers flipped, arranged in accordance with at least some embodiments described herein.

As illustrated in diagram 300 of FIG. 3, two wafers (e.g., see diagrams 100 and 200 from FIGS. 1 and 2 for example wafers) may be brought together. In the illustrated phase of vertical wafer integration of diagram 300, wafer 340 corresponds to a first wafer while wafer 330 corresponds to a second wafer that has been vertically flipped over and placed over the amorphous/porous silicon layer 318 that is over the wafer 340. In the configuration of diagram 300, the conductive paths 316 and 326 may be coupled with the amorphous/porous silicon layer 318. The wafers 330 and 340 with the amorphous/porous silicon layer 318 between them may be coupled together using an adhesive such as a heat activated adhesive or some other bonding agent. In some examples, the amorphous/porous silicon layer 318 may be used to bond the wafers together. In some embodiments, the wafers may be integrated together using a front end of line (FEOL) or back end of line (BEOL) process. The FEOL process is the first portion of semiconductor device fabrication, where the individual devices (e.g., transistors, capacitors, resistors, etc.) may be patterned in the semiconductor device. FEOL may generally include fabrication phases up to (but not including) the deposition of metal interconnect layers. Example FEOL phases may include selection of the type of wafer to be used; chemical/mechanical planarization and cleaning of the wafer; shallow trench isolation (STI); well formation; gate module formation; source and drain module formation, for example. The BEOL is the second portion of the semiconductor device fabrication, where the individual devices (e.g., transistors, capacitors, resistors, etc.) may be interconnected with wiring on the wafer. BEOL may begin when the first layer of metal is deposited on the wafer and include formation of contacts, insulating layers (dielectrics), metal layers, and formation of bonding sites for chip-to-package connections, for example.

Figure 4:
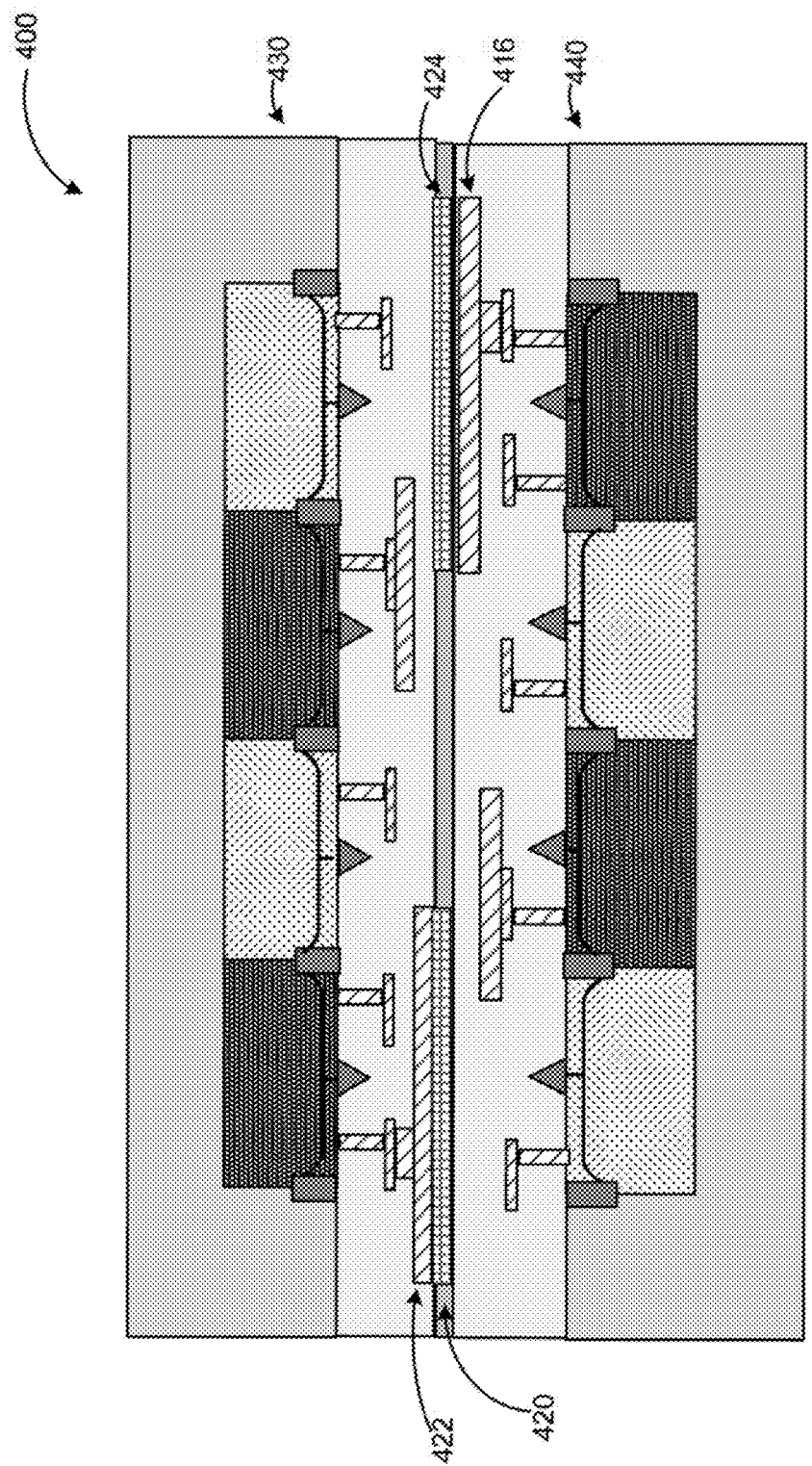
FIG. 4 illustrates two example bonded wafers following a heating phase, where portions of the silicon layer are transformed.

FIG. 4 illustrates two example bonded wafers following a heating phase, where portions of the silicon layer may be transformed in accordance with at least some embodiments described herein.

Diagram 400 shows the configuration of vertically integrated wafers of diagram 300 subsequent to a heating process. The heating or annealing process may leave the wafers 430 and 440 substantially the same, but cause portions 420 and 424 of the amorphous/porous silicon layer to react with the conductive paths 416 and 422, and change to form silicide. Other portions 418, 426, and 428 of the amorphous/porous silicon layer may be left intact.

During annealing, the wafers 430 and 440 the amorphous/porous silicon may react with the metals of the conductive paths 416 and 422 to form silicide such as Aluminum-silicide, Nickel-silicide, Titanium-silicide, Tungsten-silicide, Molybdenum-silicide, Tantalum-silicide, Copper-silicide, or similar ones. The anneal temperature may be selected based on the metal of the conductive paths 416 and 422.

Figure 5:
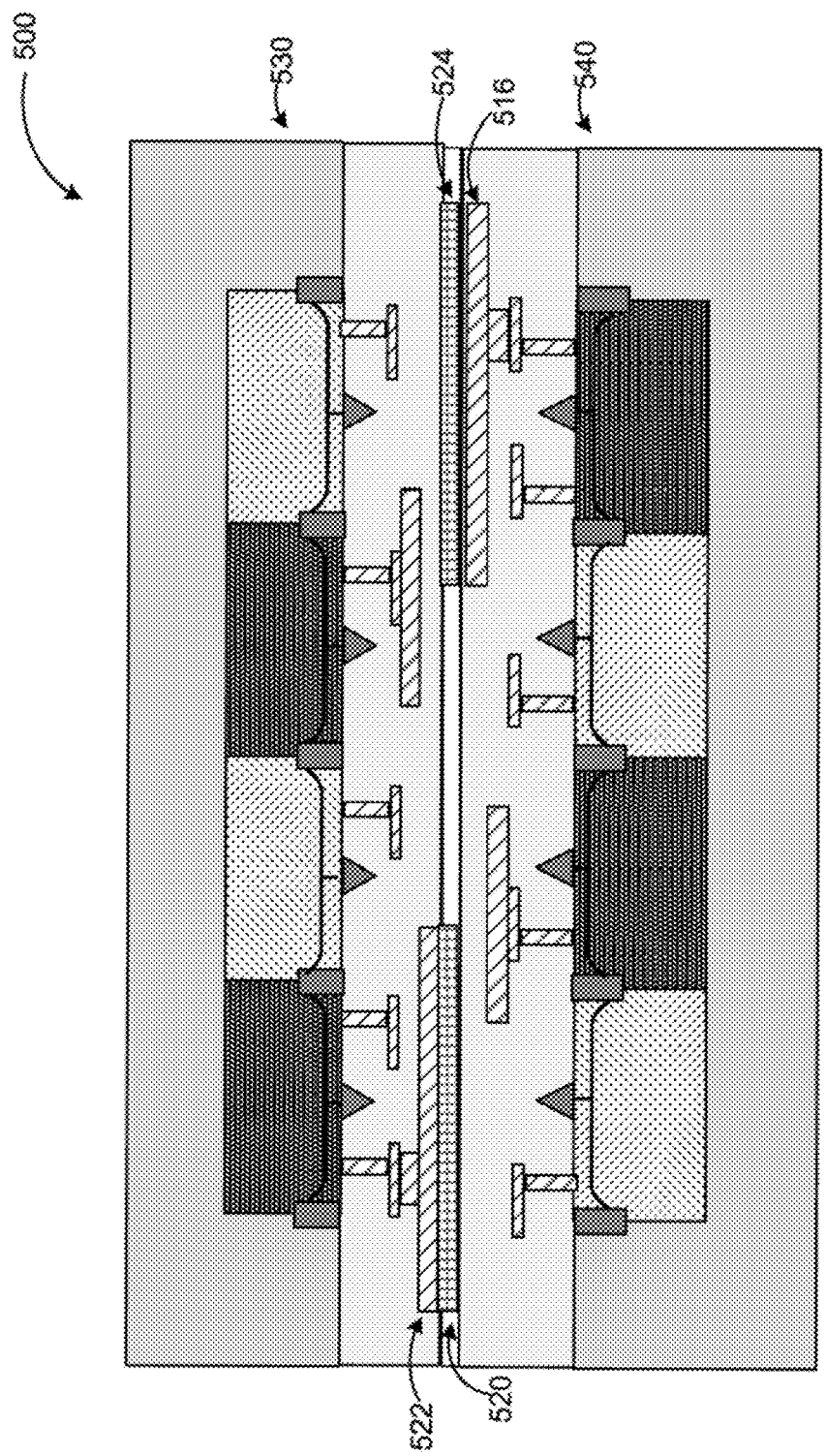
FIG. 5 illustrates two example bonded wafers following an etching phase.

FIG. 5 illustrates two example bonded wafers following an etching phase, arranged in accordance with at least some embodiments described herein.

Diagram 500 shows the configuration of vertically integrated and annealed wafers of diagram 400 subsequent to an etching process. The bonded and heated wafers 530 and 540 in diagram 500 include silicide layers 520 and 524 arranged in contact with respective conductive paths 522 and 516 of both wafers. The intact amorphous/porous silicon layer portions may be removed through wet etching, chemical etching, or a comparable process leaving empty spaces 526, 528, and 518 between the wafers 530 and 540 outside of the areas filled by the silicide layers 520 and 524.

The empty spaces 526, 528, and 518 between the wafers 530 and 540 may facilitate heat dissipation when the integrated circuits within the wafers 530 and 540 are in operation. The silicide layers 520 and 524 may provide enhanced electrical coupling between the wafers 530 and 540. In addition to the heat dissipation and electrical coupling properties of the partial silicide layer based integration of the wafers, some silicides may need lower annealing temperatures (e.g., Nickel-silicide may only need approximately 400° C.) allowing backend processes with low temperature requirements to be used.

In some embodiments, lithography may be used to pattern the amorphous/porous silicon followed by etching away the amorphous/porous silicon region, which is away from the conductive path regions. The patterning and etching may be performed after silicon deposition and before formation of the silicide, while leaving enough silicon on the conductive path regions to ensure good alignment and for the silicide formation. The wafers may then be annealed, during which the area covered with amorphous/porous silicon may react with the conductive path regions to form the silicide. As mentioned previously, the space left by the removed amorphous/porous silicon prior to the formation of the silicide may serve as heat dissipation channels. During the silicide formation, such as nitride silicide, a volume of the amorphous/porous silicon may expand. If during reaction, the involved silicon and metal volumes are large enough, the volume expansion of the amorphous/porous silicon (becoming silicide) during the silicide formation process may leave gaps on unreacted amorphous/porous silicon regions. These gaps may be used to remove the remaining amorphous/porous silicon more efficiently. In yet other embodiments, the gaps on the remaining amorphous/porous silicon regions may be used as heat dissipation channels without removal of the remaining amorphous/porous silicon regions.

Some wafer bonding processes such as copper-to-copper direct bonding may involve very flat surfaces for the wafers to be integrated, which may be hard to achieve. Silicide between metal layers, on the other hand, may provide better bonding compared to direct metal-to-metal contact. Moreover, silicide based bonding is a self-align process and thus may achieve better alignment of contacts between bonded wafers when compared to other bonding processes.

According to some example embodiments, porous silicon may be used between two bonded wafers because porous silicon may be easily etched out. Even is some silicon is not totally removed, there may be enhanced heat dissipation compared to direct contact. In direct contact, heat transfer between the wafers may be efficient resulting in less dissipation of heat when the circuits of the semiconductor devices within the wafer are in operation. Empty space (air) or left over silicon may render the heat transfer between the contacts of the wafers less efficient resulting in enhanced heat dissipation.

Figure 6:
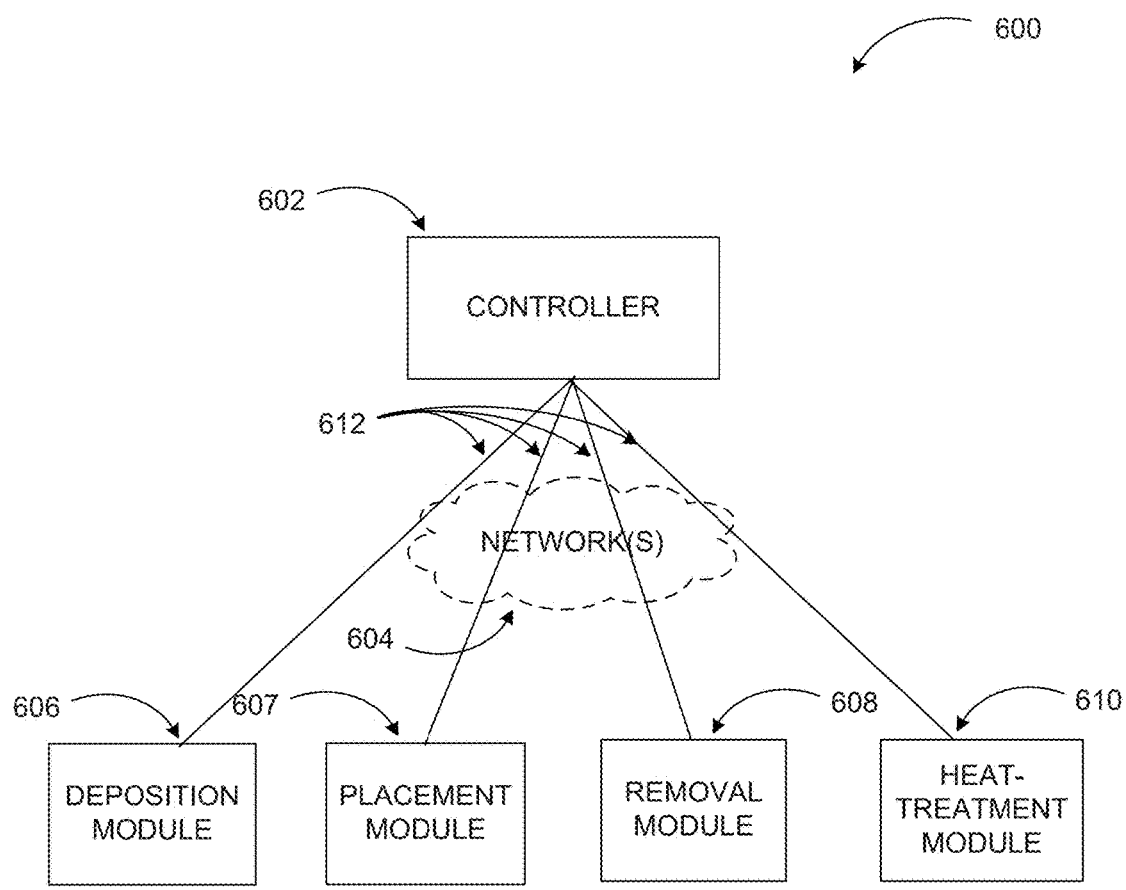
FIG. 6 illustrates an example fabrication system for vertically integrating wafers with heat dissipation mitigation.

FIG. 6 illustrates an example fabrication system for vertically integrating wafers with heat dissipation mitigation, arranged in accordance with at least some embodiments described herein.

Diagram 600 includes an example fabrication system with a controller 602, deposition module 606, placement module 607, removal module 608, and heat-treatment module 610. In some embodiments, the controller 902 may be directly coupled to the deposition module 606, placement module 607, the removal module 608, and the heat-treatment module 610 in an integrated fabrication system. In other embodiments, the controller 602 may be a remotely located controller that is communicatively coupled to the deposition module 606, placement module 607, the removal module 608, and the heat-treatment module 610. In still other examples, one or more network(s) 604, either wired or wireless, may be configured to provide communicative coupling between the controller 602 and the deposition module 606, the removal module 608, and the heat-treatment module 610.

The controller 602 may be configured to coordinate operations of one or more of the deposition module 606, placement module 607, the removal module 608, and the heat-treatment module 610, as well as other optional modules (not shown) such as a scribing module, a doping module, and similar ones. In some examples, the controller 602 may coordinate the operation of the various modules via operation of one or more control signals 612. The various control signals 612 may be of a digital format or an analog format, as may be required to interface with the corresponding module. Each signal may be generated (e.g., asserted, de-asserted, pulsed, transmitted/received, communicated, etc.) in response to operation of instructions, in some examples.

The controller 602 may correspond to a software controller, a hardware controller, or a combination thereof. Example controllers may include one or more computers, general purpose processors, special purpose processors, circuits, application specific integrated circuits (ASICs) or combinations thereof. Example processors may include micro-processors, micro-controllers, complex instruction set computer (CISCs) processors, reduced instruction set computer (RISC), or other similar variations thereof. The operation of some controller implementations may include execution of hardware based instructions such as from firmware, software based instructions, or combinations thereof.

The deposition module 606 may be configured (e.g., via one or more control signals 612 from controller 602) to perform various actions such as depositing amorphous/porous silicon layer on one or both wafers to be integrated, depositing additional adhesive materials, etc. by using various material deposition or growth techniques such as chemical vapor deposition (CVD), atomic layering deposition (ALD), sputter deposition, and similar ones.

The placement module 607 may be configured (e.g., via one or more control signals 612 from controller 602) to perform actions such as flipping one of the wafers to be integrated, positioning the wafers to overlap prior to bonding, etc.

The removal module 608 may be configured (e.g., via one or more control signals 612 from controller 602) to perform actions such as removal of portions of the amorphous/porous silicon layer prior to or post-annealing, etc. by using techniques such as wet chemical etching, gaseous chemical etching, plasma etching, and similar ones. In some embodiments, the amorphous/porous layer may be patterned and portions not over the conductive coupler surfaces removed prior to sandwiching of the wafers. In other embodiments, portions of the amorphous/porous layer not on the conductive coupler surfaces may be removed post-annealing.

The heat-treatment module 610 may be configured (e.g., via one or more control signals 612) to perform actions such as annealing of the sandwiched wafers with the amorphous/porous layer in-between, which may turn portions of the amorphous/porous layer between conductive coupler surfaces to silicide.

Embodiments are not limited to the example modules of diagram 600. A system to fabricate a vertically integrated wafers with enhanced heat dissipation and electrical contact may include additional or fewer fabrication modules, and some of the operations may be combined to be performed by the same modules. In yet other examples, the operations, such as deposition operations, may be split among multiple modules.

Figure 7:
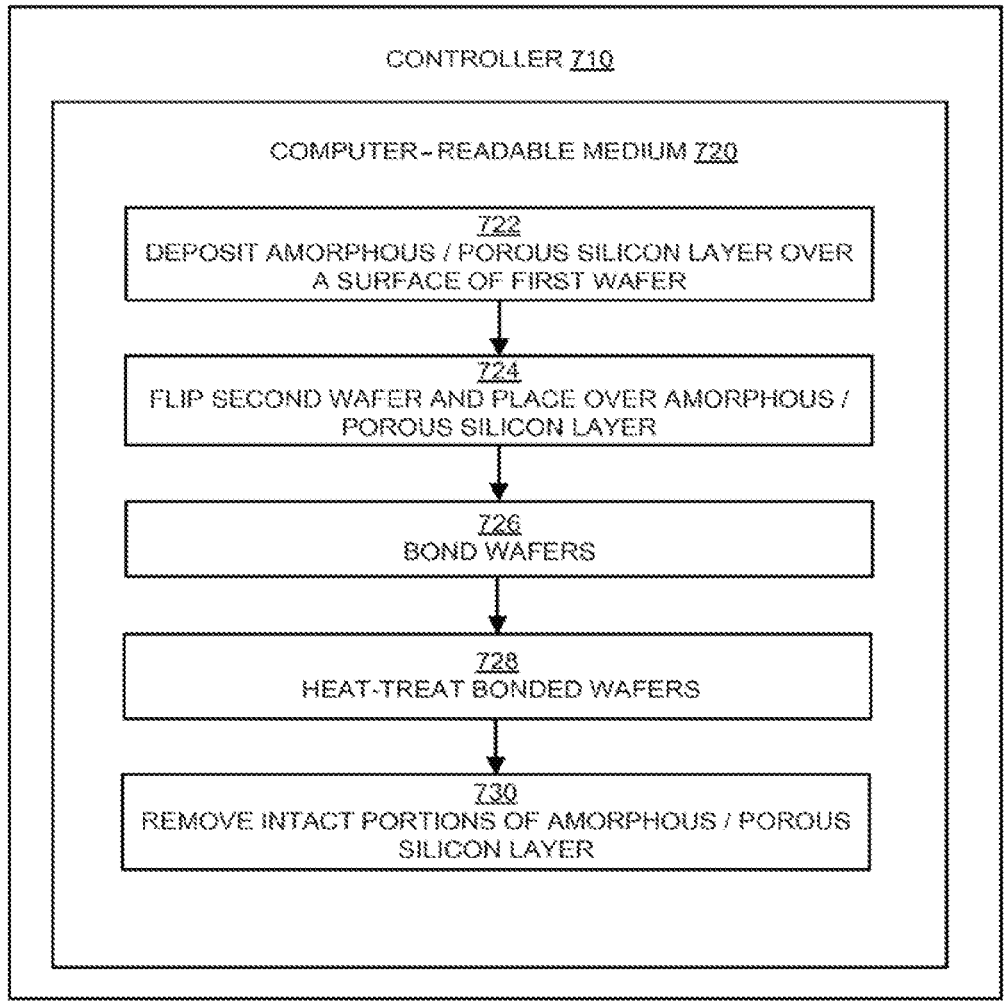
FIG. 7 is a flow diagram illustrating an example method to fabricate three-dimensionally integrated wafers, all arranged in accordance with at least some embodiments described herein.

FIG. 7 is a flow diagram illustrating an example method to fabricate three-dimensionally integrated wafers, arranged in accordance with at least some embodiments described herein.

Example methods may include one or more operations, functions or actions as illustrated by one or more of blocks 722 through 730, and may in some embodiments be performed by a controller for a wafer fabrication system. The wafer fabrication system may include a number of modules for various stages of fabrication such as etching, deposition, scribing, etc. Some or all of those modules may be managed by a controller that instructs the respective modules to perform the operations 722 through 730. In some embodiments, the controller may be a computing device such as a desktop computer, a server, a laptop computer, or other forms of computing devices. Thus, the operations described in the blocks 722-730 may also be stored as computer-executable instructions in a non-transitory computer-readable medium, such as a computer-readable medium 720 of a controller 710, and may be executable by one or more processors.

A vertically integrated wafer according to embodiments may be fabricated by the fabrication system using at least one of the semiconductor fabrication techniques selected from the group of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma enhanced CVD (PECVD), physical vapor deposition (PVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

An example process to fabricate a vertically integrated wafer with heat dissipation and enhanced contact may begin with block 722, "DEPOSIT AMORPHOUS/POROUS SILICON LAYER OVER A SURFACE OF FIRST WAFER," where amorphous/porous silicon may be deposited on a surface of one of two wafers to be bonded together. In other embodiments, top surfaces of both wafers may be treated with the amorphous/porous silicon.

Block 722 may be followed by block 724, "FLIP SECOND WAFER AND PLACE OVER AMORPHOUS/POROUS SILICON LAYER," where one of the wafers (either the one treated with amorphous/porous silicon or the untreated one) may be flipped and positioned over the other wafer to be bonded together.

Block 724 may be followed by block 726, "BOND WAFERS," where the wafers may be bonded together using various bonding techniques such as adhesive bonding (e.g., using polymers as adhesive), direct bonding, plasma activated bonding, eutectic bonding, anodic bonding, glass frit bonding, thermo-compression bonding, reactive bonding, and/or similar techniques. In other examples, the bonding may be accomplished through the subsequent annealing process.

Block 726 may be followed by block 728, "HEAT-TREAT BONDED WAFERS," where the bonded wafers may be annealed. The annealing process may cause portions of the silicon layer that are in contact with conductive coupler surfaces of the wafers to be converted to silicide.

Block 728 may be followed by block 730, "REMOVE INTACT PORTIONS OF AMORPHOUS/POROUS SILICON LAYER," where portions of the amorphous/porous silicon layer that are not in contact with conductive coupler surfaces of the wafers (portions that have not formed silicide) may be removed through etching, for example.

The blocks included in the above described process are for illustration purposes. Fabrication of three-dimensionally integrated wafers may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

According to some examples, three-dimensionally integrated semiconductor devices are described. An example semiconductor device may include a first wafer comprising a first set of semiconductor circuitry, a second wafer comprising a second set of semiconductor circuitry, and one or more silicide layers between conductive coupler surfaces of the first wafer and the second wafer, the silicide layers effective to bond the first wafer and the second wafer and to provide heat dissipation for the first set of semiconductor circuitry and the second set of semiconductor circuitry through gaps between the silicide layers.

According to other examples, the first wafer and the second wafer may be arranged such that respective surfaces of the first wafer and the second wafer face each other. The first wafer and the second wafer may include one or more conductive coupler surfaces on their respective surface. The conductive coupler surfaces may include a metal from a list of Aluminum, Nickel, Copper, Titanium, Molybdenum, Tantalum, or Tungsten. The semiconductor device may further include portions of an amorphous/porous silicon layer between the silicide layers. The amorphous/porous silicon layer between the silicide layers may include undoped silicon.

According to further examples, methods to fabricate a three-dimensionally integrated semiconductor device may be described. An example method may include depositing an amorphous/porous silicon layer on a first surface of a first wafer, positioning a first surface of a second wafer over the amorphous/porous silicon layer such that the first surface of the second wafer overlaps with the first surface of the first wafer, and bonding the first wafer and the second wafer with the amorphous/porous silicon layer between the first wafer and the second wafer. The example method may also include heat-treating the bonded first wafer and the second wafer such that silicide layers form between conductive coupler surfaces of the first wafer or second wafer and removing intact portions of the amorphous/porous silicon layer between the first wafer and the second wafer.

According to yet other examples, the method may further include depositing another amorphous/porous silicon layer on the first surface of the second wafer prior to positioning over the first wafer. Depositing the amorphous/porous silicon layer on the first surface of the first wafer and the other amorphous/porous silicon layer on the first surface of the second wafer may include one of depositing the amorphous/porous silicon layer on the first surface of the first wafer and the other amorphous/porous silicon layer on the first surface of the second wafer with substantially equal thickness; or depositing the amorphous/porous silicon layer on the first surface of the first wafer and the other amorphous/porous silicon layer on the first surface of the second wafer with different thickness.

According to yet other examples, depositing the amorphous/porous silicon layer on the first surface of the first wafer may include depositing the amorphous/porous silicon layer on the first surface of the first wafer in a thickness in a range from about 1 nm to about 100 µm. Depositing the amorphous/porous silicon layer on the first surface of the first wafer may also include depositing an undoped amorphous/porous silicon layer on the first surface of the first wafer. Heat-treating the bonded first wafer and the second wafer may include applying heat at a selected temperature such that the amorphous/porous silicon reacts with a metal content of the conductive coupler surfaces of the first wafer and the second wafer to form silicide. Removing the intact portions of the amorphous/porous silicon layer between the first wafer and the second wafer may include employing one of wet etching, chemical etching, plasma etching, or reactive ion etching (RIE).

According to other examples, methods to fabricate a three-dimensionally integrated semiconductor device may be described. An example method may include depositing an amorphous/porous silicon layer on a first surface of a first wafer, selectively removing one or more portions of the amorphous/porous silicon layer, positioning a first surface of a second wafer over the amorphous/porous silicon layer such that the first surface of the second wafer overlaps with the first surface of the first wafer, bonding the first wafer and the second wafer with the amorphous/porous silicon layer between the first wafer and the second wafer, and heat-treating the bonded first wafer and the second wafer such that silicide layers form between conductive coupler surfaces of the first wafer or second wafer.

According to some examples, the method may further include depositing another amorphous/porous silicon layer on the first surface of the second wafer prior to positioning over the first wafer. Heat-treating the bonded first wafer and the second wafer may include selecting a temperature based on a type of metal associated with conductive coupler surfaces, the type of metal including one or more of Aluminum, Nickel, Copper, Molybdenum, Tantalum, Tungsten, or Titanium; and applying heat at the selected temperature such that the amorphous/porous silicon reacts with a metal content of conductive coupler surfaces of the first wafer and the second wafer to form silicide.

According to yet further examples, a system configured to fabricate a three-dimensionally integrated semiconductor device may be described. An example system may include a deposition module configured to deposit an amorphous/porous silicon layer on a surface of a first wafer; a positioning module configured to position a surface of a second wafer over the amorphous/porous silicon layer such that a corresponding surface of the second wafer overlaps with the surface of the first wafer; and a bonding module configured to bond the first wafer and the second wafer with the amorphous/porous silicon layer between the first wafer and the second wafer. The example system may also include a heat-treatment module configured to anneal the bonded first wafer and the second wafer such that silicide layers form between conductive coupler surfaces of the first wafer and second wafer; an etching module configured to remove portions of the amorphous/porous silicon layer prior to the bonding or after the annealing; and a controller configured to coordinate operations of the deposition module, the positioning module, the bonding module, the heat-treatment module, and the etching module.

According to further examples, the deposition module may be configured to deposit the amorphous/porous silicon layer on the surface of the first wafer through one or more of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma enhanced CVD (PECVD), physical vapor deposition (PVD), metal-organic CVD (MOCVD), molecular beam epitaxy (MBE), sputter deposition, and ion implantation. The heat-treatment module may be configured to anneal the bonded first and second wafers at a temperature selected based on a type of metal content of the conductive coupler surfaces of the first and second wafers.

According to yet other examples, the etching module may be configured to remove the intact portions of the amorphous/porous silicon layer between the first wafer and the second wafer through one of wet etching, chemical etching, plasma etching, or reactive ion etching (RIE). The controller may be integrated with one or more of the deposition module, the positioning module, the bonding module, the heat-treatment module, and the etching module. Alternatively, the controller may be communicatively coupled to one or more of the deposition module, the positioning module, the bonding module, the heat-treatment module, and the etching module over one or more networks.

There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and/or firmware would be possible in light of this disclosure.

The present disclosure is not to be limited in terms of the particular embodiments described in this application, which are intended as illustrations of various aspects. Many modifications and variations can be made without departing from its spirit and scope, Functionally equivalent methods and apparatuses within the scope of the disclosure, in addition to those enumerated herein, will be possible from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected", or "operably coupled", to each other to achieve the particular functionality, and any two components capable of being so associated may also be viewed as being "operably couplable", to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to fabricate a three-dimensionally integrated semiconductor device, the method comprising:
    depositing an amorphous/porous silicon layer on a first surface of a first wafer;
    positioning a first surface of a second wafer over the amorphous/porous silicon layer such that the first surface of the second wafer overlaps the first surface of the first wafer;
    bonding the first wafer and the second wafer with the amorphous/porous silicon layer between the first wafer and the second water;
    heat-treating the bonded first wafer and the second wafer effective to facilitate a reaction between a first portion of the amorphous/porous silicon layer and a first conductive coupler surface and also effective to facilitate a reaction between a second portion of the amorphous/porous silicon layer and a second conductive coupler surface to form silicide,
        wherein the heat-treatment causes a volume expansion of the amorphous/porous silicon layer that results in a formation of gaps on unreacted portions of the amorphous/porous silicon layer; and
    removing the unreacted portions of the amorphous/porous silicon layer between the first wafer and the second wafer.

2. The method of claim 1, further comprising:
    depositing another amorphous/porous silicon layer on the first surface of the second wafer prior to positioning the first surface of the second wafer over the amorphous/porous silicon layer such that the first surface of the second wafer overlaps the first surface of the first wafer.

3. The method of claim 2, further comprising one of
    depositing the amorphous/porous silicon layer on the first surface of the first wafer and depositing the other amorphous/porous silicon layer on the first surface of the second wafer with substantially equal thickness; or
    depositing the amorphous/porous silicon layer on the first surface of the first wafer and depositing the other amorphous/porous silicon layer on the first surface of the second wafer with different thickness.

4. The method of claim 1, wherein depositing the amorphous/porous silicon layer on the first surface of the first wafer occurs in a range from about 1 nm to about 100 μm.

5. The method of claim 1, wherein depositing the amorphous/porous silicon layer on the first surface of the first wafer occurs by:
    depositing an undoped amorphous/porous silicon layer on the first surface of the first wafer.

6. The method of claim 1, wherein heat-treating the bonded first wafer and the second wafer occurs by a process that includes:
    applying heat at a selected temperature such that the amorphous/porous silicon reacts with a metal content of the conductive coupler surfaces of the first wafer and the second wafer to form silicide.

7. The method of claim 1, further comprising:
    removing the unreacted portions of the amorphous/porous silicon layer between the first wafer and the second wafer by a process that includes employing one of wet etching, chemical etching, plasma etching, and reactive ion etching (RIE).

8. The method of claim 1, wherein the amorphous/porous silicon layer includes a porosity in a range from about 0% porosity to about 80% porosity.

9. The method of claim 1, further comprising:
integrating the first wafer and the second wafer using one of a front end of line (FEOL) or a back end of line (BEOL) process.

\* \* \* \* \*

UNITED STATES PATENT AND TRADEMARK OFFICE
CERTIFICATE OF CORRECTION

PATENT NO. : 9,508,685 B2  Page 1 of 1
APPLICATION NO. : 14/445991
DATED : November 29, 2016
INVENTOR(S) : Luo It is certified that error appears in the above-identified patent and that said Letters Patent is hereby corrected as shown below:

In the Specification

In Column 11, Line 53, delete "scope, Functionally" and insert -- scope. Functionally --, therefor.

In the Claims

In Column 14, Line 34, in Claim 3, delete "one of" and insert -- one of: --, therefor.

Signed and Sealed this
Fourth Day of April, 2017

Michelle K. Lee
*Director of the United States Patent and Trademark Office*